United States Patent
Ogura et al.

(10) Patent No.: US 6,248,633 B1
(45) Date of Patent: Jun. 19, 2001

(54) PROCESS FOR MAKING AND PROGRAMMING AND OPERATING A DUAL-BIT MULTI-LEVEL BALLISTIC MONOS MEMORY

(75) Inventors: Seiki Ogura, Wappingers Falls, NY (US); Yutaba Hayashi, Tsukuba (JP); Tomoko Ogura, Wappingers Falls, NY (US)

(73) Assignee: Halo LSI Design & Device Technology, Inc., Wappinger Falls, NY (US)

( * ) Notice: Subject to any disclaimer, the term of this patent is extended or adjusted under 35 U.S.C. 154(b) by 0 days.

(21) Appl. No.: 09/426,692

(22) Filed: Oct. 25, 1999

(51) Int. Cl.[7] .............................................. H01L 21/8247
(52) U.S. Cl. .......................................... 438/267; 438/287
(58) Field of Search ................................... 438/257–267, 438/287

(56) References Cited

U.S. PATENT DOCUMENTS

| | | | |
|---|---|---|---|
| 5,324,675 | * 6/1994 | Hayabuchi . | |
| 5,851,881 | * 12/1998 | Lin et al. | 438/261 |
| 5,930,631 | * 7/1999 | Wang et al. | 438/286 |
| 6,140,676 | * 10/2000 | Lancaster | 257/315 |
| 6,166,410 | * 12/2000 | Lin et al. | 257/324 |

OTHER PUBLICATIONS

Chang et al., "A New SONOS Memory Using Source–Side Injection for Programming", IEEE Electron Device Letters, vol. 19, No. 7, pp. 253–255, Jul. 1998.

Ogura et al., "Low Voltage, Low Current, High Speed Program Step Split Gate Cell with Ballistic Direct Injection for EEPROM/Flash", IEDM 1998, p. 987.

* cited by examiner

Primary Examiner—Richard Booth

(74) Attorney, Agent, or Firm—George O. Saile; Stephen B. Ackerman; Rosemary L. S. Pike

(57) ABSTRACT

A fast low voltage ballistic program, ultra-short channel, ultra-high density, dual-bit multi-level flash memory is described with a two or three polysilicon split gate side wall process. The structure and operation of this invention is enabled by a twin MONOS cell structure having an ultra-short control gate channel of less than 40nm, with ballistic injection which provides high electron injection efficiency and very fast program at low program voltages of 3~5V. The cell structure is realized by (i) placing side wall control gates over a composite of Oxide-Nitride-Oxide (ONO) on both sides of the word gate, and (ii) forming the control gates and bit diffusion by self-alignment and sharing the control gates and bit diffusions between memory cells for high density. Key elements used in this process are: 1) Disposable side wall process to fabricate the ultra short channel and the side wall control gate with or without a step structure, and 2) Self-aligned definition of the control gate over the storage nitride and the bit line diffusion, which also runs in the same direction as the control gate. The features of fast program, low voltage, ultra-high density, dual-bit, multi-level MONOS NVRAM of the present invention include: 1) Electron memory storage in nitride regions within an ONO layer underlying the control gates, 2) high density dual-bit cell in which there are two nitride memory storage elements per cell, 3) high density dual-bit cell can store multi-levels in each of the nitride regions, 4) low current program controlled by the word gate and control gate, 5) fast, low voltage program by ballistic injection utilizing the controllable ultra-short channel MONOS, and 6) side wall control poly gates to program and read multi-levels while masking out memory storage state effects of the unselected adjacent nitride regions and memory cells. The ballistic MONOS memory cell is arranged in the following array: each memory cell contains two nitride regions for one word gate, and ½ a source diffusion and ½ a bit diffusion. Control gates can be defined separately or shared together over the same diffusion. Diffusions are shared between cells and run in parallel to the side wall control gates, and perpendicular to the word line.

64 Claims, 11 Drawing Sheets

PROCESS FOR MAKING AND PROGRAMMING AND OPERATING A DUAL-BIT MULTI-LEVEL BALLISTIC MONOS MEMORY

BACKGROUND OF THE INVENTION

1) Field of Invention

The invention relates to methods of forming high-density Metal/polysilicon Oxide Nitride Oxide Silicon (MONOS) memory arrays and the resulting high density MONOS memory arrays.

2) Description of Prior Art

Floating gate and MONOS are two types of non-volatile memories. In conventional floating gate structures, electrons are stored onto a floating gate, by either F-N tunneling or source side injection. Conventional MONOS devices store electrons usually by direct tunneling in the Oxide-Nitride-Oxide (ONO) layer which is below the memory word gate. Electrons are trapped in the Nitride layer of the ONO composite. The MONOS transistor requires one less polysilicon layer than the floating gate device, which simplifies the process and could result in a denser array.

MONOS structures are conventionally planar devices in which an ONO composite layer is deposited beneath the word gate. The thickness of the bottom oxide of the ONO layer is required be less than 3.6 nm, in order to utilize direct tunneling for program operations. However in 1998, a MONOS structure with a bottom oxide thickness of 5.0 nm, and side wall polysilicon gates and source side injection program was first reported by Kuo-Tung Chang et al, in, "A New SONOS Memory Using Source Side Injection for Programming", *IEEE Electron Letters*, Vol.19, No. 7, July 1998. In this structure, as shown in FIG. 1, a side wall spacer 20 is formed on one side of the word gate by a typical side wall process, and the ONO composite 22 is underneath the side wall gate, instead of under the word gate as for conventional MONOS memory cells. The channel under the SONOS side wall control gate is larger than 100 nm, so the program mechanism is source side injection, which is faster and requires lower voltages than electron tunneling, despite the thicker bottom oxide. During source side injection, a channel potential is formed at the gap between the side wall gate and the select/word gate. Channel electrons 30 are accelerated in this gap region and become hot enough to inject into the ONO layer. Thus Kuo-Tung Chang's SONOS memory is able to achieve better program performance than previous direct tunneling MONOS cells.

While the SONOS memory cell is unique among MONOS memories for its split gate structure and source side injection program, its structure and principles of program are similar to those for a conventional split gate floating gate device. Both cell types have a word gate and side wall spacer gate in series. The most significant differences lie in the manner of side wall gates utilization and electron storage regions. In the split gate floating gate cell, the side wall spacer is a floating gate onto which electrons are stored. The floating gate voltage is determined by capacitance coupling between the word gate, diffusion, and floating gate. For the SONOS cell, electrons are stored in the nitride region beneath the side wall spacer, which is called the control gate. The nitride region voltage is directly controlled by the voltage of the above side wall gate.

A floating gate memory cell having faster program and higher density was introduced in co-pending U.S. patent application Ser. No. 09/313,302 to the same inventors, filed on May 17, 1999. FIG. 3A is an array schematic and FIG. 3B is a layout cross-section of this fast program, dual-bit, and high density memory cell. In this memory structure, high density is achieved by pairing two side wall floating gates to one word gate (for example, floating gates 312 and 313 and word gate 341), and sharing interchangeable source-drain diffusions (321 and 322) between cells. Thus a single memory cell has two sites of electron storage. Additional polysilicon lines "control gates" run in parallel to the diffusions and orthogonal to the word gates. The control gates (331 and 332) couple to the floating gates and provide another dimension of control in order to individually select a floating gate from its pair. This memory is further characterized by fast programming due to ballistic injection. Using the same device structure, if the side wall gate channel is reduced to less than 40 nm with proper impurity profiles, the injection mechanism changes from source side injection to a new and much more efficient injection mechanism called ballistic injection. The ballistic injection mechanism has been proven by S. Ogura in "Step Split Gate Cell with Ballistic Direction Injection for EEPROM/Flash", *IEDM* 1998, pp.987. In FIG. 2A, results between ballistic injection (line 25) and conventional source side injection (line 27) are compared for a floating gate memory cell. Although the structures are very similar, when the control gate is 100 nm, the injection mechanism is source side injection. However, as illustrated in FIG. 2B, when the channel is reduced to 40 nm to satisfy the short channel length requirement for ballistic injection (line 35), program speed increases by three orders of magnitude under the same bias conditions, or at half of the floating gate voltage requirement for source side injection (line 37).

In contrast, the side wall channel length of Kuo Tung Chang's SONOS memory structure is 200 nm, so the program mechanism is source side injection. Thus there is a significant dependence between the short channel length and the injection mechanism.

SUMMARY OF THE INVENTION

In this invention, a fast low voltage ballistic program, ultra-short channel, ultra-high density, dual-bit multi-level flash memory is achieved with a two or three polysilicon split gate side wall process. The structure and operation of this invention is enabled by a twin MONOS cell structure having an ultra-short control gate channel of less than 40 nm, with ballistic injection (S. Ogura) which provides high electron injection efficiency and very fast program at low program voltages of 3~5V. The cell structure is realized by (i) placing side wall control gates over a composite of Oxide-Nitride-Oxide (ONO) on both sides of the word gate, and (ii) forming the control gates and bit diffusion by self-alignment and sharing the control gates and bit diffusions between memory cells for high density. Key elements used in this process are:

(i) Disposable side wall process to fabricate the ultra short channel and the side wall control gate with or without a step structure.

(ii) Self-aligned definition of the control gate over the storage nitride and the bit line diffusion, which also runs in the same direction as the control gate.

The features of fast program, low voltage, ultra-high density, dual-bit, multi-level MONOS NVRAM of the present invention include:

1. Electron memory storage in nitride regions within an ONO layer underlying the control gates.
2. High density dual-bit cell in which there are two nitride memory storage elements per cell
3. High density dual-bit cell can store multi-levels in each of the nitride regions
4. Low current program controlled by the word gate and control gate
5. Fast, low voltage program by ballistic injection utilizing the controllable ultra-short channel MONOS
6. Side wall control poly gates to program and read multi-levels while masking out memory storage state effects of the unselected adjacent nitride regions and memory cells.

The ballistic MONOS memory cell is arranged in the following array: each memory cell contains two nitride regions for one word gate, and ½ a source diffusion and ½ a bit diffusion. Control gates can be defined separately or shared together over the same diffusion. Diffusions are shared between cells and run in parallel to the side wall control gates, and perpendicular to the word line.

A summary of the operating conditions for multi-level storage is given in FIG. 3B. During read, the following conditions need to be met: the voltage of the unselected control gate within a selected memory cell must be greater than the threshold voltage of the control+source voltage. The word select gate in the control gate pair is raised to the threshold voltage of the word gate+an override delta of around 0.5V+source voltage (Vt−wl+Voverdrive+Vs). Un-selected MONOS cells will be disabled by reducing the associated control gates to 0V. Program conditions are: Word line voltage is greater than threshold+an overdrive voltage delta for low current program. Both control gates in the selected pair are greater than Vt-high (the highest threshold voltage within the range of multi-level thresholds)+override delta. Adjacent memory cells sharing the same word line voltage are disabled by adjusting the control gates only.

BRIEF DESCRIPTION OF THE DRAWINGS

In the accompanying drawings forming a material part of this description, there is shown.

DESCRIPTION OF THE PREFERRED EMBODIMENTS

Presented in this invention is a fabrication method for a ballistic twin MONOS memory cell with two nitride memory elements and two shared control gates. The method can be applied to a device with a flat channel and/or a device having a step channel under the nitride layer in the MONOS cell.

Figure 4A:
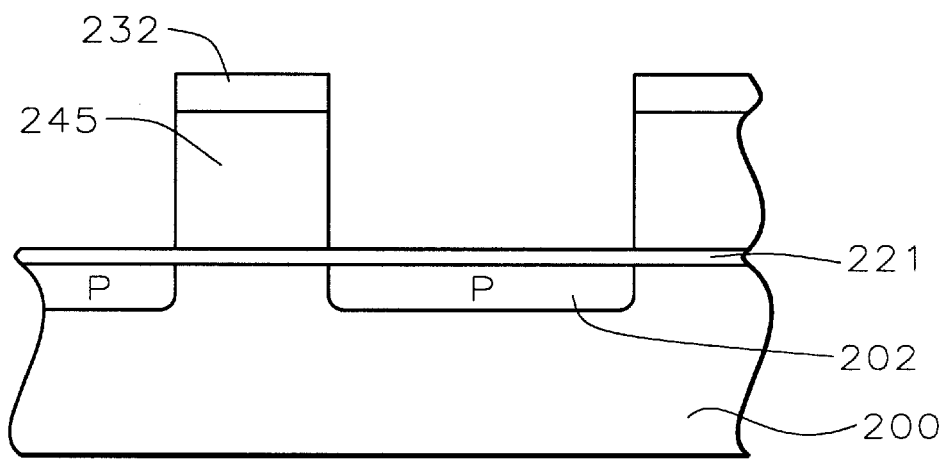
FIGS. 4A through 4F are cross sectional representations of a first preferred embodiment of the process of the present invention.

The procedures for formation of shallow trench isolation, p-well, and n-well are the same as for conventional CMOS processing and will not be shown. The polysilicon word gate is also defined by conventional CMOS processing as shown in FIG. 4A. In order to define the word gate, the memory gate silicon oxide 221 is formed to a thickness of between about 5 and 10 nanometers. Then the polysilicon 245 with a thickness of between about 150 and 250 nm for the gate material is deposited by chemical vapor deposition (CVD). A nitride layer 232 is deposited by CVD to a thickness of between about 50 and 100 nm to be used later as an etch stop layer for chemical mechanical polishing (CMP). Normal CMOS processing defines the memory word gates; i.e., photoresist and masking processes with exposure, development, and vertical etching of the nitride 232 and polysilicon 245 by reactive ion etching (RIE) are performed. Extra boron 202 is ion implanted at low energy (less than about 10 keV energy) with an ion dosage of between 3E12 to 3E13 ions per $cm^2$, in order to adjust VT under the floating gate. After removing the photoresist which was used to define the word gate, the word gate is obtained as shown in FIG. 4A.

Figure 4B:
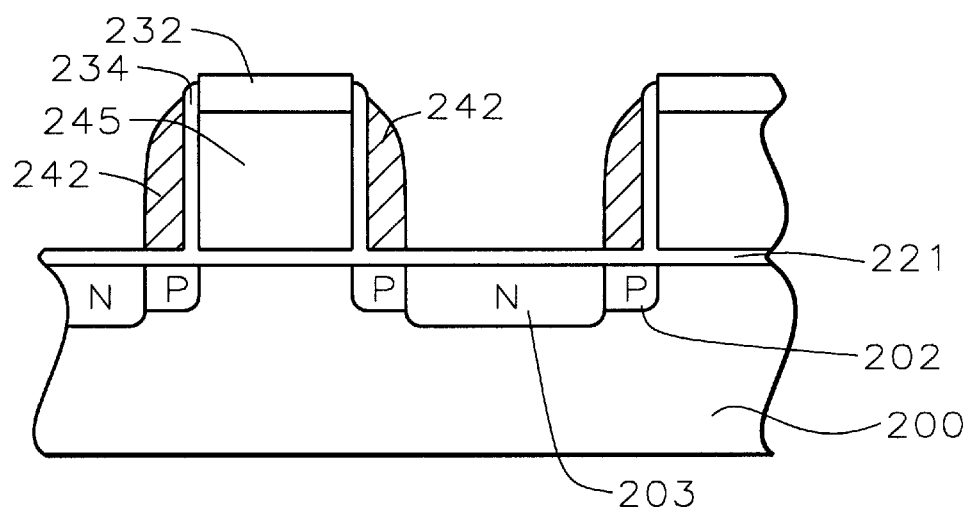

A thin silicon oxide layer 234 of between about 5 and 10 nm can be thermally grown on the side wall polysilicon, or $SiO_2$ and/or SiN film can be deposited by uniform CVD, as shown in FIG. 4B. Then the disposable sidewall process, which defines a controllably short channel and provides fast programming by high electron injection efficiency, is performed. A thin polysilicon layer typically having a thickness of between about 30 to 50 nm is deposited. Then a vertical or anisotropic polysilicon etch is performed, which forms the disposable sidewall spacer 242 on both sides of the word gate 245, as shown in FIG. 4B. Implantation with an N dopant 203 such as arsenic is performed with an ion dosage of between 3E13 and $4E13/cm^2$ at 10 to 15 KeV. Thus, the thickness of the polysilicon layer determines the effective channel length under the control gate.

Figure 4C:
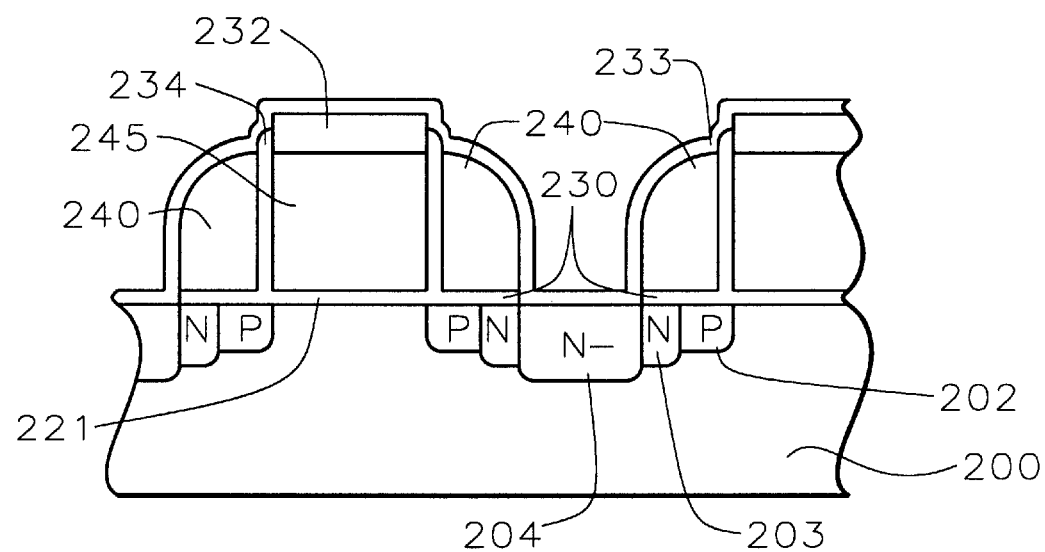

Referring now to FIG. 4C, the disposable side wall spacer 242 is gently removed by a dry chemical anisotropic etch. A typical etch ambient for this step is $HBr/C)_2/O_2$. The bottom silicon oxide 221 is then gently etched out by buffered (with for example water of ammonium hydroxide) hydrofluoric acid (BHF), Vapor HF, or a reactive ion etch such as $CF_2/O_2$. A composite layer of oxide-nitride-oxide 230 is formed. Layer 230 is shown without the three layers for simplicity. The bottom oxide is thermally grown and the thickness is between 3.6 and 5 nm, which is slightly thicker than the limit of direct tunneling (3.6 nm), the silicon nitride layer deposited by chemical vapor deposition is about 2 to 5 nm, and the top oxide is deposited by CVD deposition and is between about 4 and 8 nm. Thermal oxidation may be added to improve the top oxide quality. Also short nitridation in an $N_2O$ environment can be added to improve the bottom oxide reliability prior to the deposition of the nitride layer.

Now, an insitu phosphorus-doped thin polysilicon layer between about 30 and 50 nm and tungsten silicide between 60 and 100 nm is deposited by CVD. The composite layer of polysilicon and tungsten suicide becomes the control sidewall spacer gate. A vertical, anisotropic reactive etch is performed to form the sidewall control gate 240, as shown in FIG. 4C. The composite oxide-nitride-oxide layer is also etched through, leaving this ONO layer 230 only underlying the sidewall control gates.

A thin CVD of silicon oxide or nitride 233 with a thickness of about 10 nm is deposited. Phosphorus and /or Arsenic for n+ junction 204 is implanted subsequently, at a dosage of between 3E14 to 5E15 ions per cm$^2$, as shown in FIG. 4C. The total thickness is between 90 to 150 nm, which is equal to the summation of effective control gate channel length and lateral out diffusion of the n+ junction.

Figure 4D:
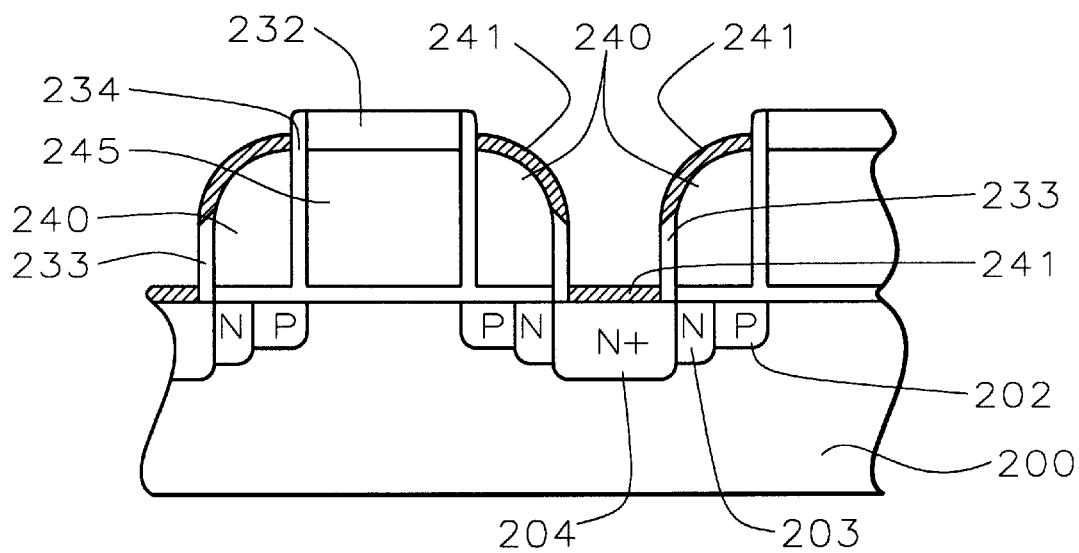

As an option, the sidewall spacer gate 240 can be simply an insitu phosphorus or As doped polysilicon layer instead of the composite layer of polysilicon and tungsten silicide. After the formation of the n+ junction and the deposition of a thin CVD of silicon oxide or nitride 233 with a thickness of about 10 nm, the vertical reactive ion etch is performed to form sidewall oxide spacer 233 on the gate 240 when the control gate requires low resistivity and silicidation, as shown in FIG. 4D. In typical silicidation, about 10 nm Co or Ti is deposited by plasma sputtering and a Rapid Thermal Anneal at about 650° C. is performed. The formation of silicide layer 241 on the top part of gate 240 and diffusion 204 are shown in FIG. 4D. Although silicidation 241 is shown in FIG. 4D, it is not required. It is an option to reduce the RC time constant of the control gate lines or diffusion lines in order to improve performance in all modes of operation, read, program, and erase.

An oxide and/or nitride layer 235 for contamination barrier is deposited by CVD. Then a layer of CVD silicon oxide or BSG 247 is deposited to fill the gap. The gap fill material is polished by CMP up to the nitride layer 232.

As an option, the gap fill material 247 can be a conductive material like polysilicon or W, which can be used for reducing the RC time constant of the sidewall gate or bit diffusion depending on the need. When the conductive layer is polished by CMP up to the nitride layer 232, the conductive layer is several hundred nanometers (50 nm) recessed by vertical reactive ion etch. Then a CVD $SiO_2$ layer (about 50 nm) is deposited and CMP is performed as illustrated by 236 as shown in FIG. 4E.

Figure 4E:
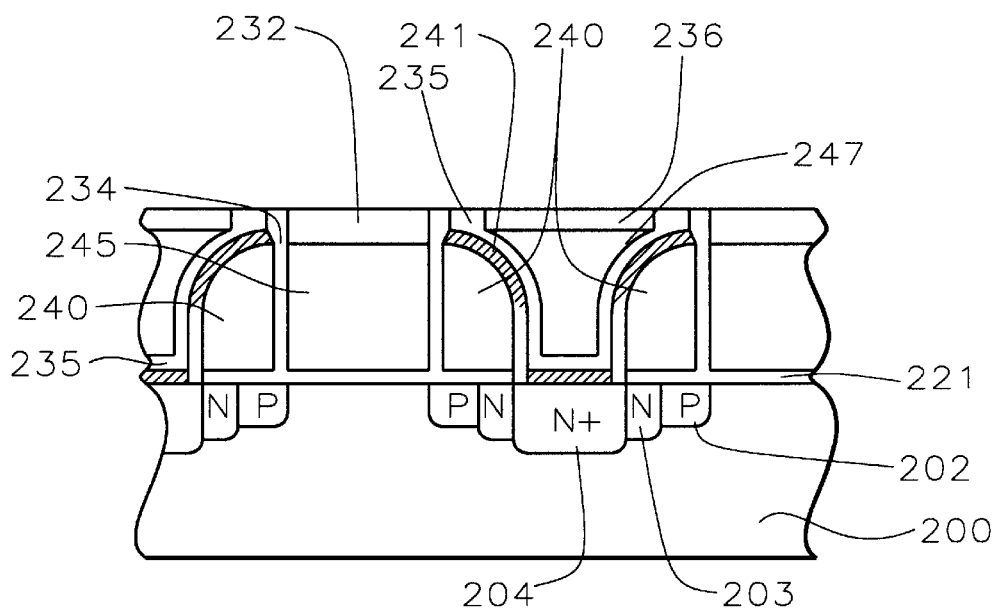
Figure 4F:
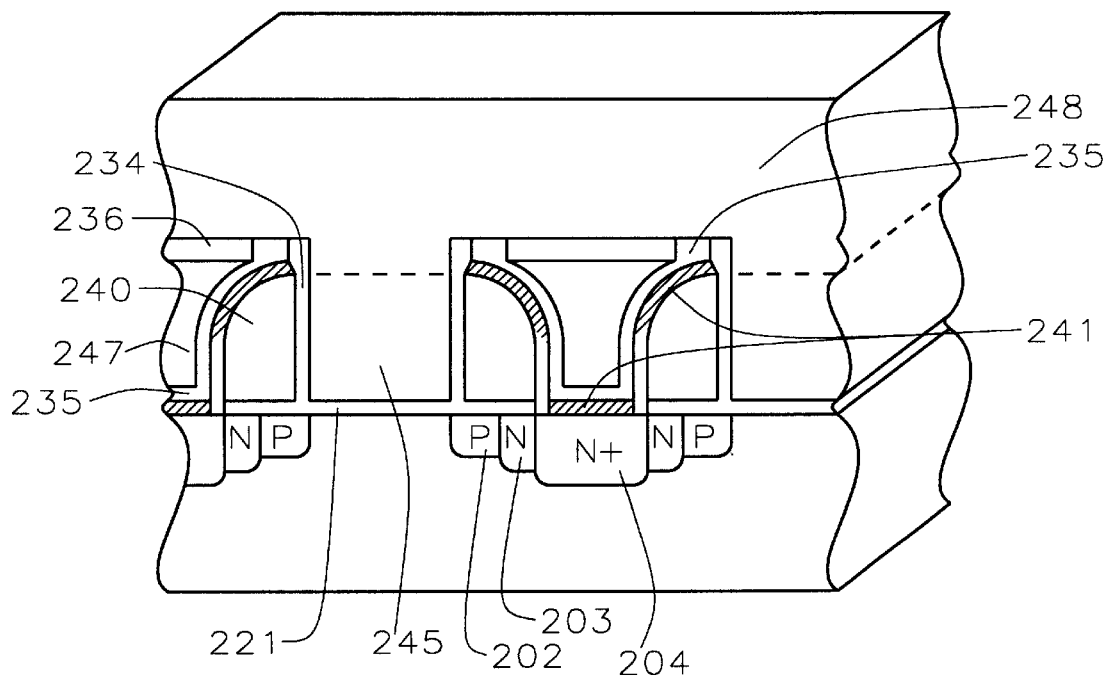

The nitride layer 232 in FIG. 4E is selectively etched by $H_3PO_4$ or etched by a chemical dry etch. The polysilicon layer thickness of between 150 and 200 nm is deposited by CVD. This polysilicon layer 248 and the underlying polysilicon word gate 245 are defined by normal photoresist and RIE processes. The structure at this point is as shown in FIG. 4F.

Figure 4G:
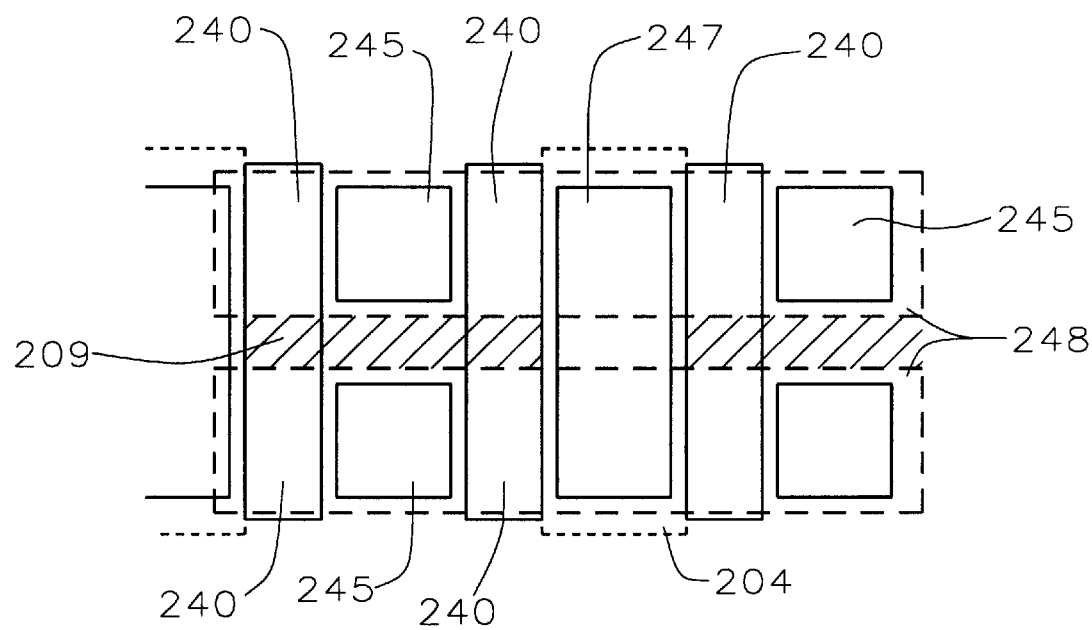
FIG. 4G is a bird eye's view of the completed memory cell of the present invention.

The polysilicon layer 248 acts as a word line wire by connecting adjacent word line gates. The final memory cell is completed at this point. This word polysilicon layer can be silicided with Ti or Co to reduce the sheet resistance. A typical bird's-eye view of the memory cell is shown in FIG. 4G. The shallow trench isolation region is shown by area 209 in FIG. 4G.

The preceding processes describe fabrication of planar channel floating gates with very short channel (30 to 50 nm). By modifying and adding a few process steps, a step split structure with more efficient ballistic injection can be fabricated using the same process integration scheme as the planar structure. This second embodiment of the present invention will be described with reference to FIGS. 5A, 5B, and 5C.

Figure 5A:
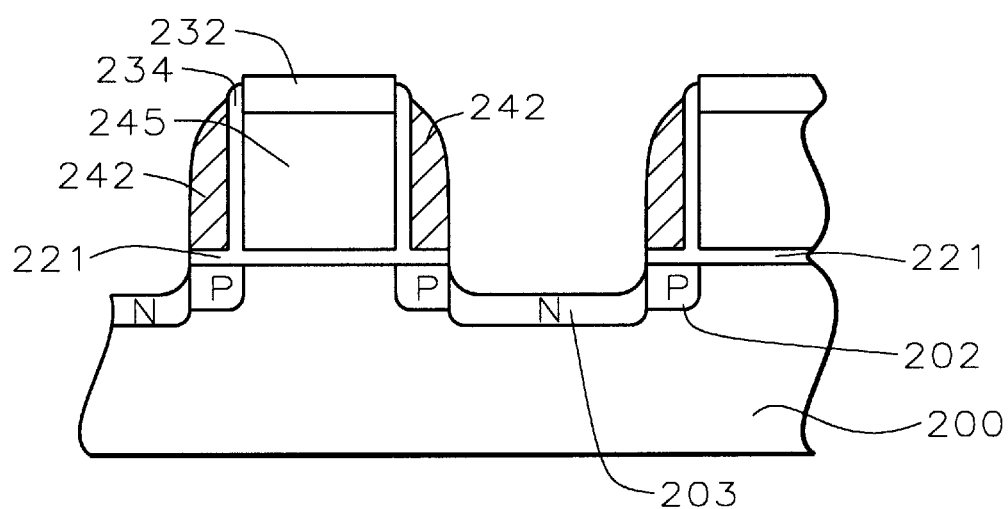
FIGS. 5A, 5B, and 5C are cross sectional representations of a second preferred embodiment of the process of the present invention.

After forming disposable sidewall spacer 242 by etching vertically the doped polysilicon, the silicon oxide layer 221 is vertically etched which corresponds to FIG. 4B. In order to form a step split memory cell, the deviation starts at this point by continuing to etch into the silicon substrate by approximately 20 to 50 nm. Then the bottom of the step is lightly implanted with Arsenic to form N-region 203 using the poly sidewall as a mask as shown in FIG. 5A, where the dosage is about 3E13 to 4E13/cm$^2$ at 10 to 15 KeV. Next, the N+ doped polysilicon disposable spacer is selectively removed by a wet etch ($HNO_3$/HF/Acitic acid, or $H_3PO_4$ or $NH_4OH$) or a dry plasma etch to the lightly doped bulk N– region. The bulk etching during this disposable spacer etch can be included as part of step etching. After gently etching off the left over gate oxide 221 under the disposable polysilicon spacer, the silicon surface is cleaned. The total step into silicon should be about 20 to 50 nm. If the step corner is sharp, corner rounding by rapid thermal anneal (RTA) at between about 1000 to 1100° C. for about 60 seconds can be added as an option or a hydrogen anneal at 900° C. and at a pressure of 200 to 300 mtorr can be performed. After these modifications and additions, the fabrication sequence returns to the procedures described previously.

Figure 5B:
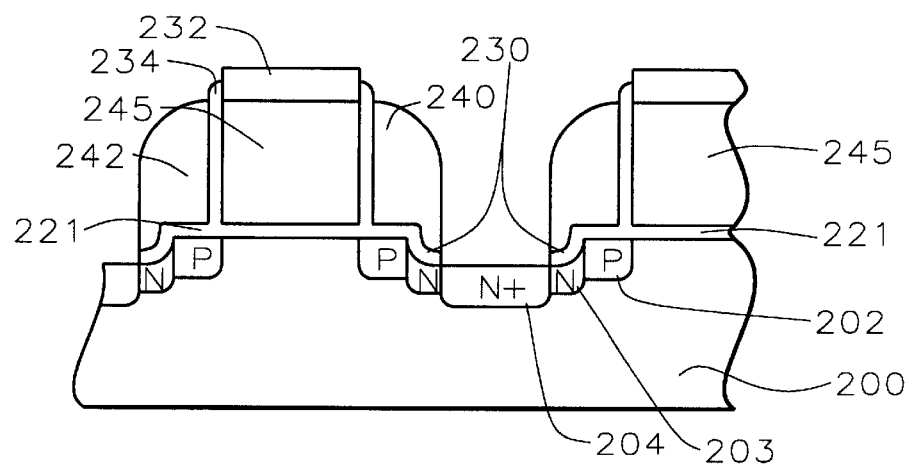

Referring to FIG. 5B, a composite layer of oxide-nitride-oxide is formed. Layer 230 is shown without the three layers for simplicity. The bottom oxide is thermally grown and the thickness is between 3.6 and 5 nm, which is slightly thicker than the limit of direct tunneling (3.6 nm), the silicon nitride layer deposited by chemical vapor deposition (CVD) is about 2 to 5 nm, and the top oxide is deposited by CVD deposition and is between about 4 and 8 nm. Thermal oxidation may be added to improve the top oxide quality. Also, short nitridation in an $N_2O$ environment can be added to improve the bottom oxide reliability prior to the deposition of the nitride layer.

Figure 5C:
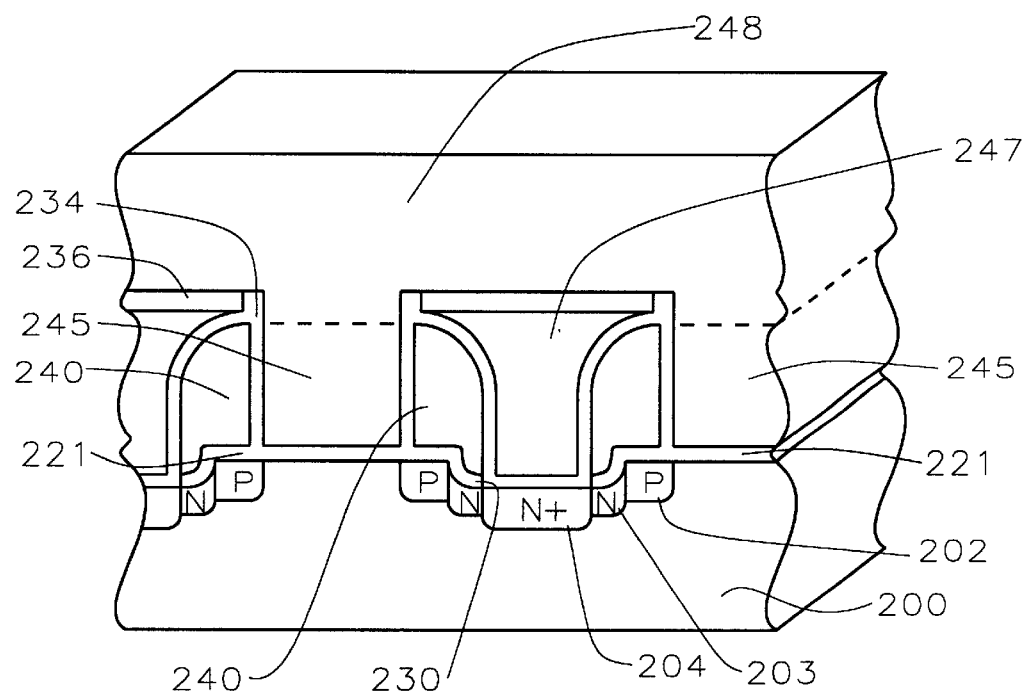

Then an insitu phosphorous-doped polysilicon layer, which becomes the control gate, is deposited having a thickness of between 90 to 180 nm, and a vertical or anisotropic polysilicon etch is performed to form the sidewall gate 240, a shown in FIG. 5B. By following the process steps given for the planar split device, the step-split device can be fabricated as shown in FIG. 5C. This sidewall polysilicon gate can be silicided or replaced by refractory silicide as utilized in the first embodiment of the flat channel MONOS twin cell.

In the above process steps for both the planar and step devices, the disposable side wall spacer 242 can be plasma nitride or oxynitride or Boron Phosphorus Silicate Glass (BPSG) instead of polysilicon, since the etching rate of that material to the thermal silicon oxide can be very high (for example at least 10–100 times) in $H_3PO_4$ acid or diluted HF.

Figure 6A:
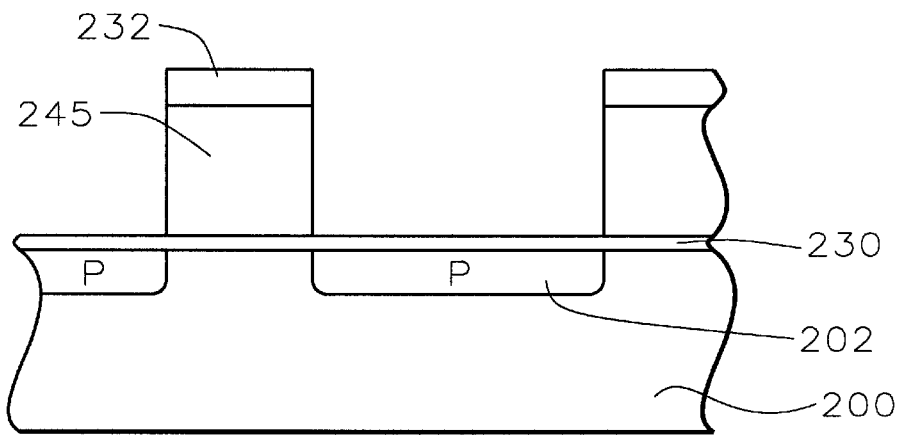
FIGS. 6A through 6E are cross sectional representations of a third preferred embodiment of the process of the present invention.
Figure 6B:
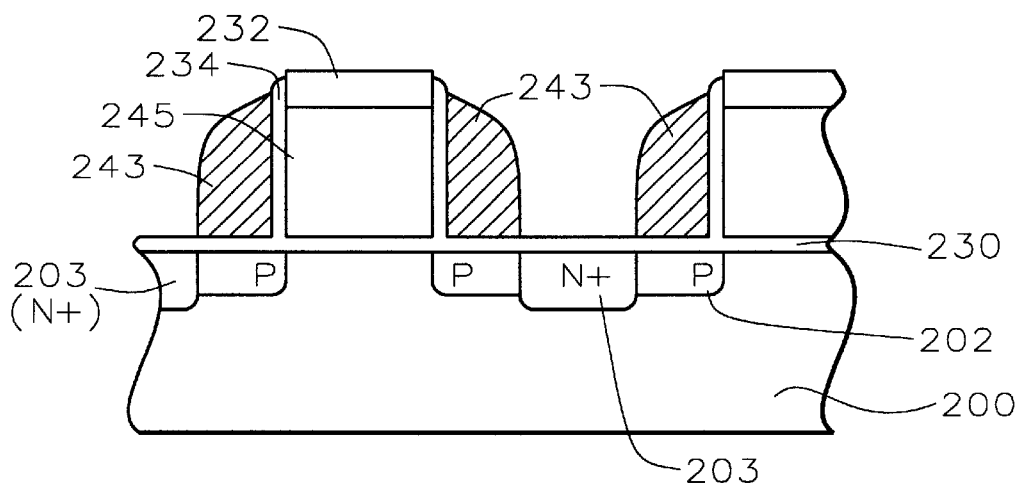

A third embodiment of the present invention will be described with reference to FIGS. 6A–6D and 6F. The third embodiment of the present invention will be a simplified process of the first embodiment of the planar twin MONOS memory cell with a slight program speed penalty because controllability will be lost due to the usage of a single large spacer instead of two side wall spacers. Deviation from the normal CMOS process starts prior to deposition of word gate polysilicon 245. A composite layer of oxide-nitride-oxide (ONO), 230 in FIG. 6A, is formed. Layer 230 is again shown without the three layers for simplicity. The bottom silicon oxide layer is preferred to be grown thermally with a thickness of between about 3.6 nm to 5 nm, the silicon nitride layer deposited by CVD deposition is about 2 to 5 nm and the top oxide layer is deposited by CVD deposition and about 5 to 8 nm thick. The top oxide CVD layer is slightly thicker compared to the first and second process embodiments, for subsequent polysilicon and disposable sidewall spacer etch stop. Then the polysilicon 245 for gate material is deposited by CVD and followed by CVD silicon nitride 232 deposition thickness of between about 50 to 100 nm.

Then a photoresist layer is formed and a masking process with exposure and development to define memory gates 245 are performed. The polysilicon layer is now etched vertically by reactive ion etching (RIE), using the under layer top silicon oxide in the composite layer 230 as a etch stop. Then extra boron 202 is ion implanted at low energy (less than 10 keV power and ion dosage of between about 5E12 to 2 E13 ions per cm², also shallow As is implanted at the same time at about 5E12 to 1.5E13 at the same KeV range as is the boron, as shown in FIG. 6A. Even though the channel threshold is very low due to As compensation, there is plenty of impurity to create a channel potential drop in the short channel region. (See co-pending U.S. patent application Ser. No. 09/419,561 to the same inventors, filed on , Oct. 18, 1999 now U.S. Pat. No. 6,177,318. (Halo 99-003) This step is shown in FIG. 6A.

A thin silicon oxide layer 234 of about 5 nm is thermally grown on the side of polysilicon or CVD uniformly deposited. Then a disposable polysilicon layer typically having a thickness of between about 90 to 150 nm is deposited. Then the vertical or anisotropic polysilicon etch is performed, which forms the disposable sidewall spacer 243 in FIG. 6B. This is a thicker spacer than in the first and second embodiments. Then As ions are implanted at dosage of between 1E15 to 5E15 cm² and at the energy range of 20 to 50 KeV through the composite layer of oxide-nitride in order to form an N+ junction 204. By adjusting the lateral out diffusion with annealing temperature and time (between 850 to 900° C. and 5 to 20 min), the channel length defined from the edge of the word gate to the N+ junction edge is designed to be about 30 to 50 nm (3 to 4 times the electron mean free length) for ballistic high injection efficiency at low voltage.

Afterwards, the disposable side wall spacer 243 is gently removed by a dry chemical, isotropic etch. A typical etch ambient for this step is $HBr/CL_2/O_2$. The exposed silicon oxide over nitride is gently etched out by buffered hydrofluoric acid. A fresh silicon oxide 244 replacing the top oxide in the composite ONO 230, shown in FIG. 6C, of about 4 to 6 nm is deposited by chemical vapor deposition. Thermal oxidation is added after the top layer is deposited to improve the top oxide quality.

As an option, prior to removal of the disposable sidewall spacer 243, the exposed top two layers of oxide-nitride are etched by RIE. Then the fresh oxide of about 4 to 6 nm is deposited by chemical vapor deposition and followed by thermal oxidation for the top oxide improvement. During this oxidation process of about 850 to 900° C. and 10 min in wet $O_2$ atmosphere an extra oxide layer of about 20 nm is formed on the nitride cut area over the n+ junction as shown by 244 in FIG. 6D. This thick oxide reduces the coupling capacitance between control gate 240 and bit diffusion 204.

Figure 6C:
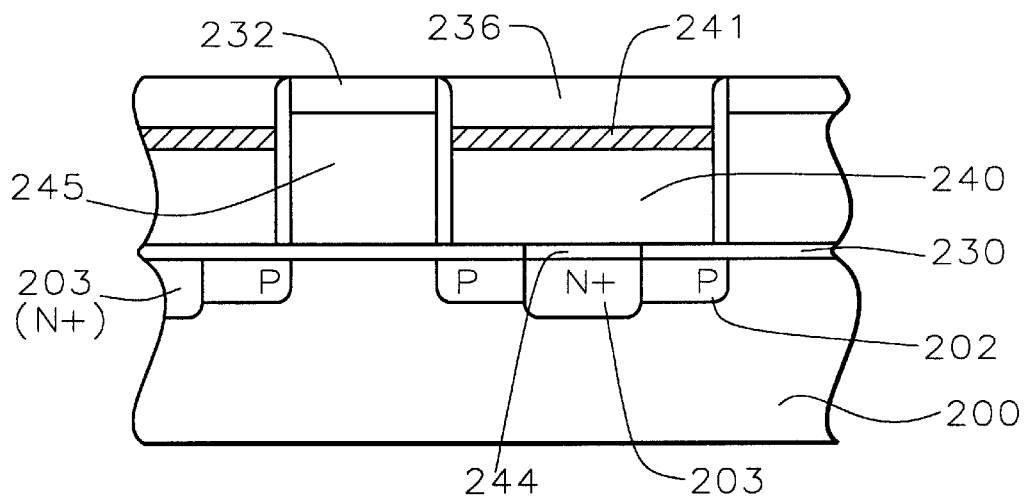
Figure 6D:
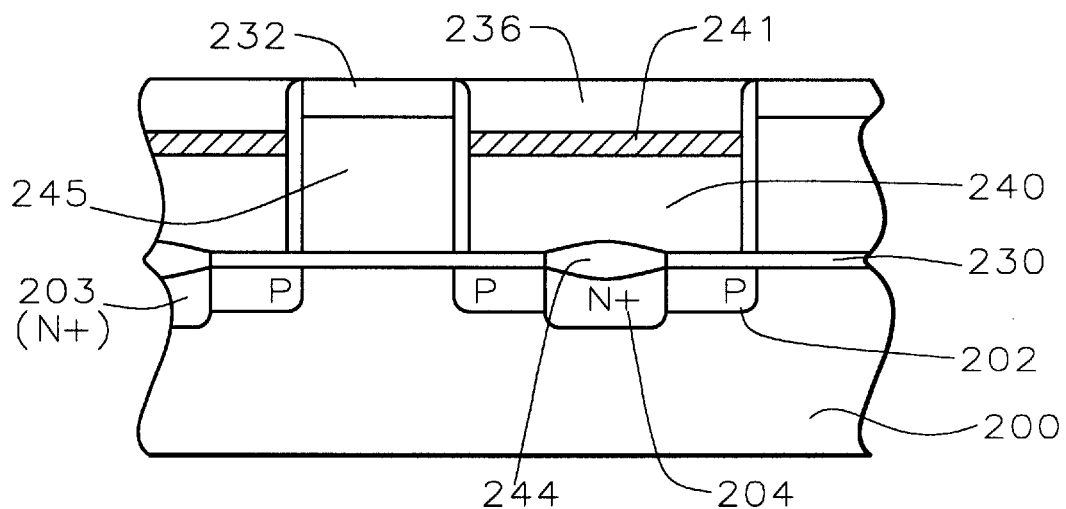
Figure 6E:
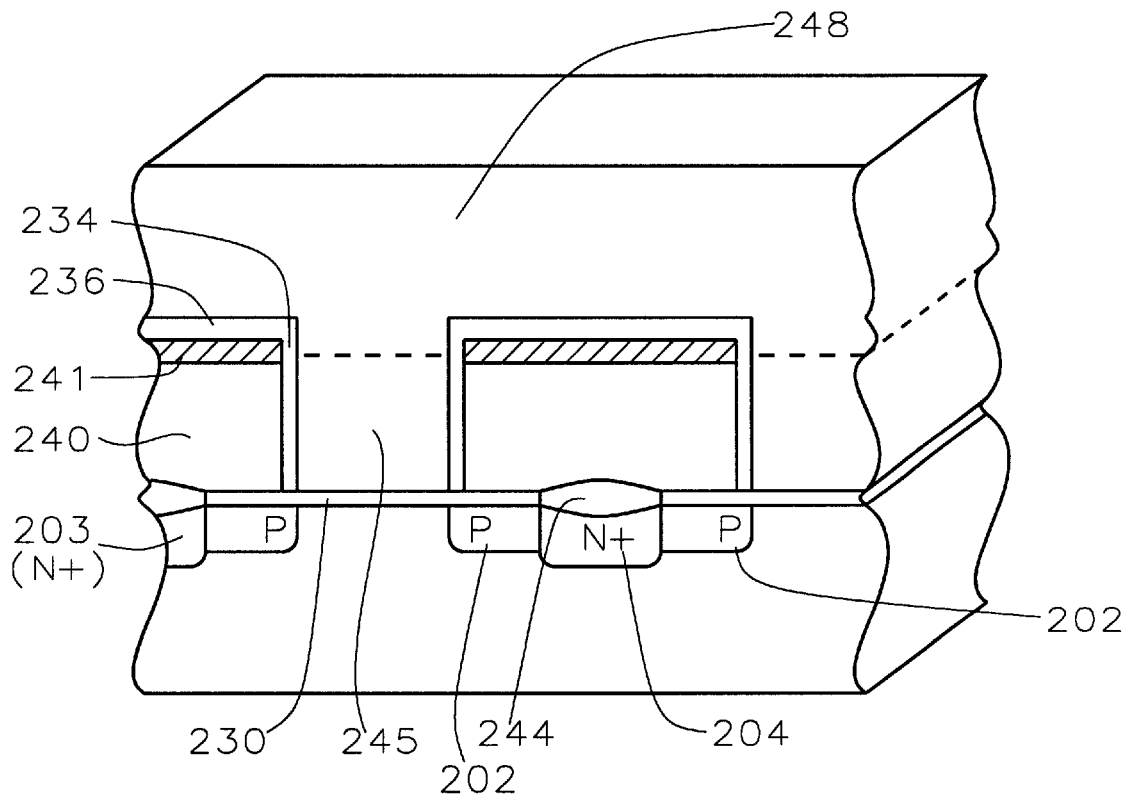

A layer of polysilicon approximately 300 nm, which is slightly thicker than the summation of word polysilicon 245 and the top nitride 232 height, is deposited and CMP is performed using the nitride layer as the etch stop layer. Then the filled polysilicon layer 240 is recessed about 50 nm by a vertical, anisotropic reactive ion etch. Then thin Ti or Co of about 10 nm is deposited and silicidation is performed. The silicide layer 241 is to reduce the control gate resistance. A CVD $SiO_2$ deposition and CMP is performed again, as illustrated by 236. The cross section of the device at this point is shown in FIG. 6C and in FIG. 6D.

Then the nitride layer 232 is selectively etched by $H_3PO_4$ or etched by a chemical dry etch. The polysilicon layer 248 having a thickness of between 150 and 200 nm is deposited by CVD. This polysilicon layer and underlying word gate polysilicon 245 are defined by normal photoresist and RIE processes. The structure at this point is as shown in FIG. 6F.

The polysilicon layer 248 acts as a word line wire by connecting adjacent word line gates. The final memory cell is completed at this point. This word polysilicon layer can be silicided with Ti or Co to reduce the sheet resistance. A typical bird's-eye view of the memory cell is shown in FIG. 4G. The shallow trench isolation region is provided by the area 209. It is understood that these critical dimensions will scale with the technology as the critical dimension is reduced.

In the embodiments described above, two approaches have been combined to improve memory density in this invention. In the first approach, density is more than doubled by sharing as many cell elements as possible. A single word select gate is shared between two nitride charge storage regions, and source lines/bit lines as well as control gate lines are shared between adjacent cells. In the second approach, multi-level thresholds are stored in the nitride regions under the control gates, and specific voltage and control conditions have been developed in order to make multi-level sensing and program possible for the high density array, with good margins between each of the threshold levels.

OPERATING METHOD FOR MULTILEVEL STORAGE

The procedures described below can be applied to multi-level storage of two bits or greater, as well as single-bit/two level storage applications in which Vt-hi and Vt-low are the highest and lowest threshold voltages, respectively, to be stored in the nitride region under the control gate. The dual bit nature of the memory cell comes from the association of two nitride regions paired to a single word gate and the interchangeability of source and drain regions between cells. This cell structure can be obtained by a side wall deposition process, and fabrication and operation concepts can be applied to both a step split ballistic transistor and/or a planar split gate ballistic transistor. The step split and the planar ballistic transistors have low programming voltages, fast program times, and thin oxides.

Figure 7A:
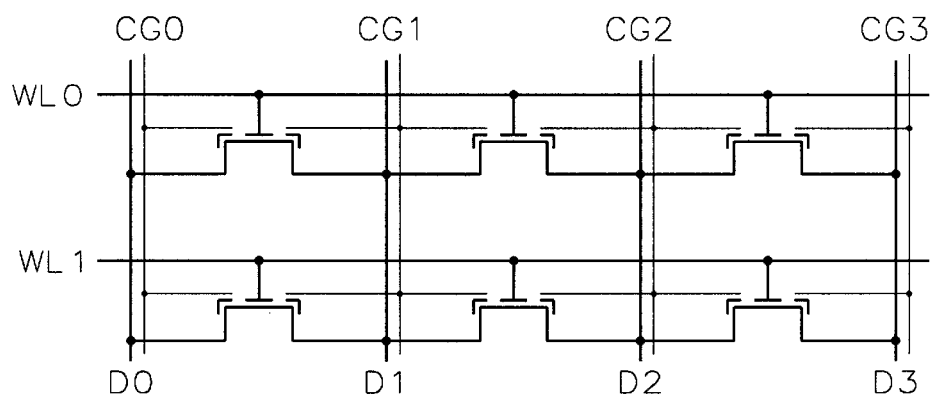
FIG. 7A is an array schematic of the present invention.
Figure 7B:
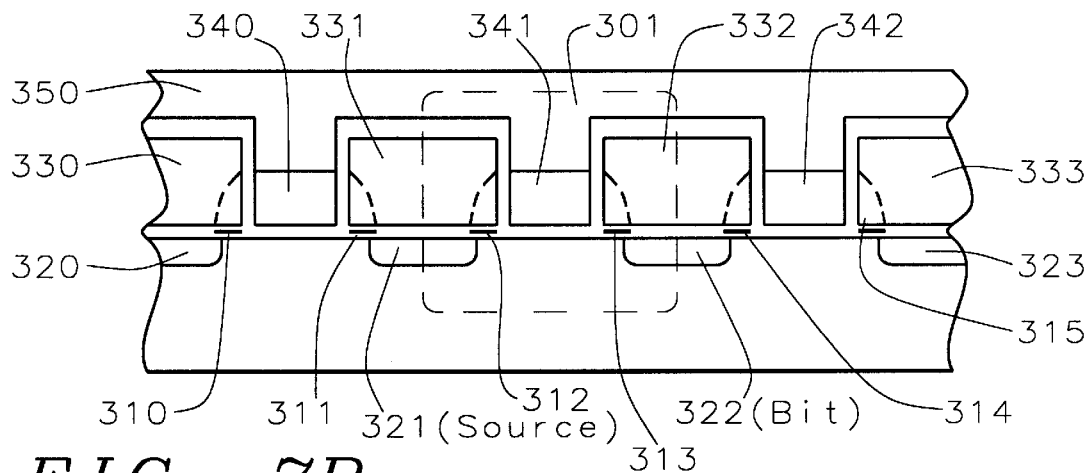
FIG. 7B is a cross-sectional representation of the present invention.
Figure 7C:
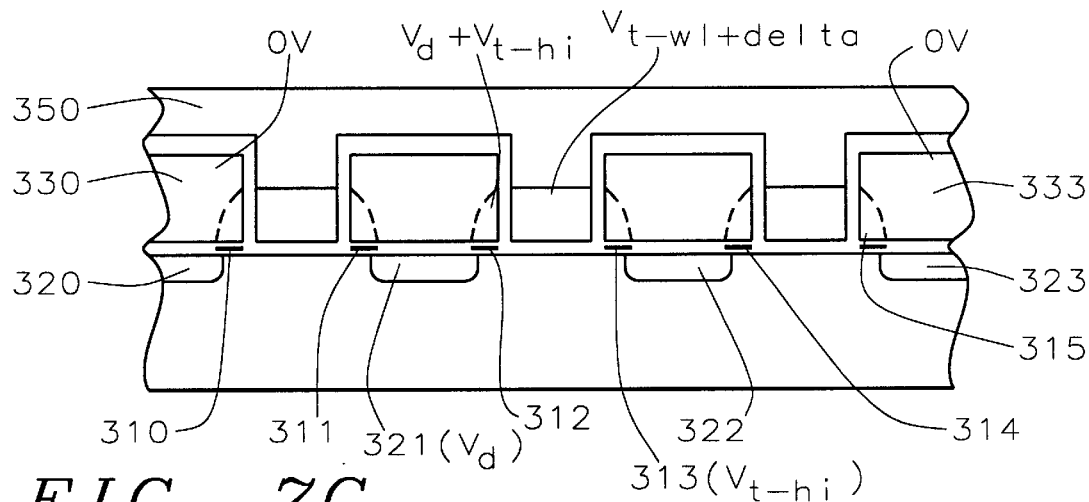
FIG. 7C gives the required voltage conditions during read for the present invention.

A cross-section of the array for a planar split gate ballistic transistor application is shown in FIG. 7B. All word gates 340, 341, and 342 are formed in first level polysilicon and connected together to form a word line 350. ONO is formed underneath the sidewalls that are deposited in pairs on either side of the word gates 340, 341, and 342. The nitride within the ONO layer which is under each sidewall is the actual region for electron memory storage. These nitride regions are 310, 311, 312, 313, 314, 315 in FIGS. 7B and 7C. In order to simplify peripheral decode circuitry, two side wall control gates sharing the same diffusion will be connected together to form a single control gate 330, 331, 332, 333, according to process embodiment 3 and embodiments 1 and 2 in which the gap-filling material 247 is a conductor. In the cases of process embodiments 1 and 2 in which two side wall gates sharing a diffusion are isolated from each other (where the gap-filling material is an insulator), it is feasible to electrically connect these two gates together with a wire outside of the memory array. Although it is also possible to operate the memory array with individual sidewall gates as control gates, peripheral logic will become more cumbersome, which does not meet the interests of high density memory.

Nitride regions 311 and 312 share control gate 331, and nitride regions 313 and 314 share control gate 332. A memory cell 301 can be described as having a source diffusion 321 and bit diffusion 322, with three gates in series between the source diffusion and the bit diffusion, a control gate 331 with underlying nitride region 312, a word gate 341, and another control gate 332 with underlying nitride region 313. The word gate 341 is a simple logical ON/OFF switch, and the control gates allow individual expression of a selected nitride region's voltage state during read. Two nitride charge regions which share the same word gate will be hereinafter referred to as a "nitride charge region pair". Within a single memory cell 301, one nitride charge region 313 is selected within a nitride charge region pair for read access or program operations. The "selected nitride charge region" 313 will refer to the selected nitride region of a selected nitride pair. The "unselected nitride charge region" 312 will refer to the unselected nitride charge region of a selected nitride charge region pair. "Near adjacent nitride charge regions" 311 and 314 will refer to the nitride charge regions of the nitride charge pairs in the adjacent unselected memory cells which are closest to the selected memory cell 301. "Far unselected adjacent nitride charge regions" 310 and 315 will refer to the nitride charge regions opposite the near unselected adjacent nitride charge regions within the same unselected adjacent memory cell nitride charge region pairs. The "source" diffusion 321 of a selected memory cell will be the farther of the two memory cell diffusions from the selected nitride charge region and the junction closest to the selected nitride charge region will be referred to as the "bit" diffusion 322.

In this invention, control gate voltages are manipulated to isolate the behavior of an individual nitride charge region from a pair of nitride charge regions. There are three control gate voltage states: "over-ride", "express", and "suppress". A description of the control gate voltage states follows, in which the word line voltage is assumed to be 2.0V, the "bit" diffusion voltage is 0V, and the "source" diffusion voltage is assumed to be 1.2V. It should be understood that the voltages given are examples for only one of many possible applications, depending on the features of the process technology, and are not to be limiting in any way. In the over-ride state, the V(CG) is raised to a high voltage (~5V) forcing the channel under the control gate to conduct regardless of the charge stored in the nitride regions. In the express state, the control gate voltage is raised to about Vt-hi (2.0V), and the channel under the control gate will conduct, depending on the programmed state of the nitride regions. In suppress-mode, the control gate is set to 0V to suppress conduction of the underlying channels.

Table 1 gives the voltages during read of selected nitride region 313.

TABLE 1

Voltages for Read of Selected FG = 313

| Vd0 320 | Vcg 0 330 | Vw1 340 | Vd1 321 | Vcg 1 331 | Vw1 341 | Vd2 322 | Vcg 2 332 | Vw1 342 | Vd3 323 | Vcg 3 333 |
|---|---|---|---|---|---|---|---|---|---|---|
| 0* | 0 | 2.5 | 1.2 | 5 | 2.5 | ~0 | 2.5 | 2.5 | 0* | 0 |

*If threshold voltage is slightly negative, it is possible to suppress the nitride threshold region with a slightly negative control gate voltage (about −0.7 V)

Figure 1:
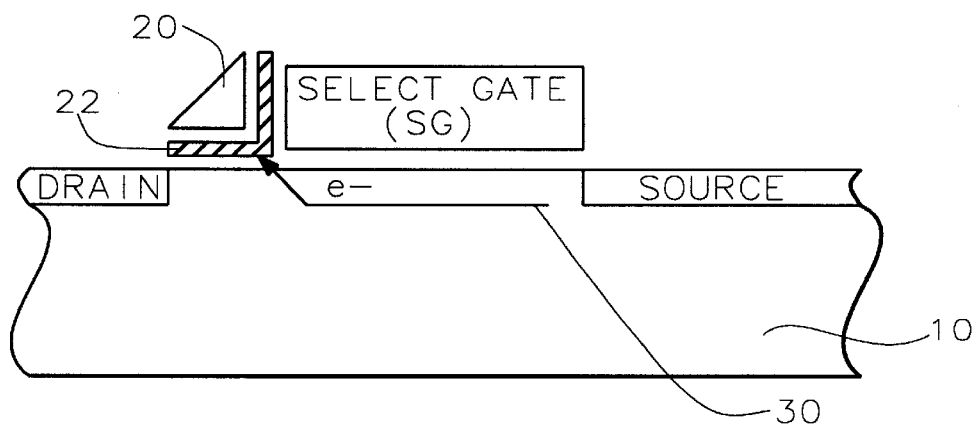
FIG. 1 is a device structure of prior art SONOS (Silicon Oxide Nitride Oxide Silicon).
Figure 2A:
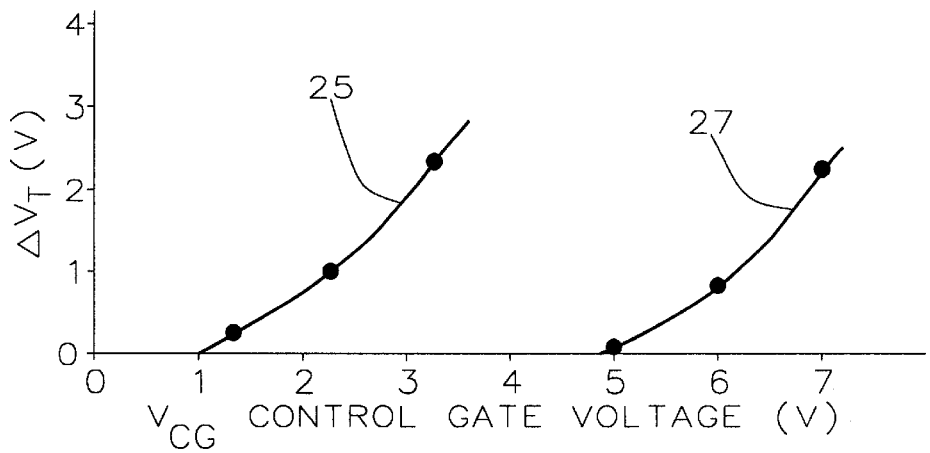
FIG. 2A graphically represents empirical results for a split gate floating gate transistor, demonstrating that for a channel length of 100 nm, source side injection requires high voltage operation.
Figure 2B:
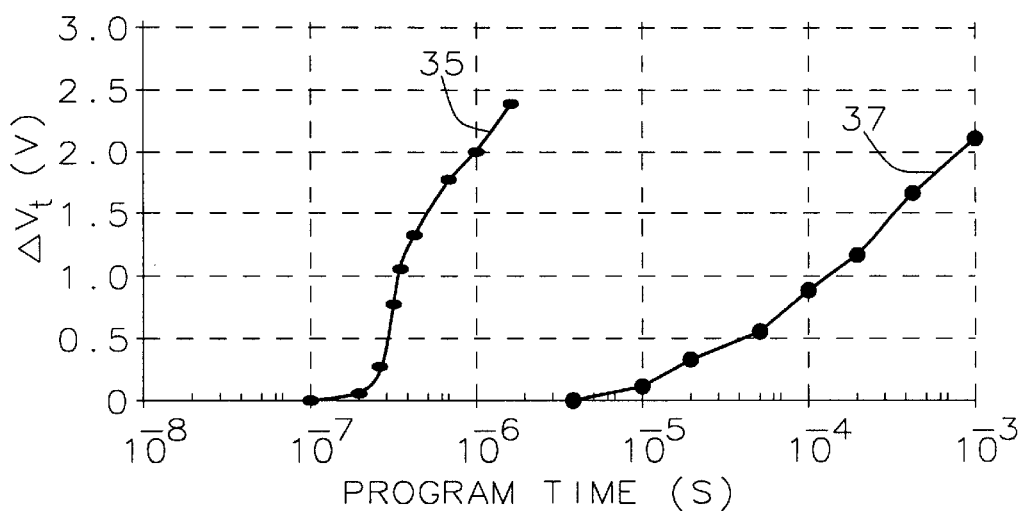
FIG. 2B graphically represents empirical results for a split gate floating gate transistor showing that for a channel length of 40 nm, ballistic injection operates at much lower voltages and/or much faster program speed.
Figure 3A:
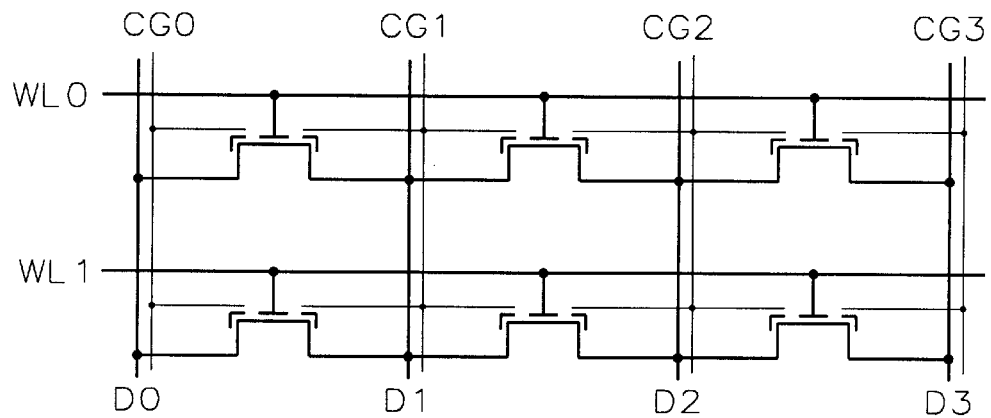
FIG. 3A is an array schematic of the prior art double side wall dual-bit split floating gate cell with ultra short ballistic channel.
Figure 3B:
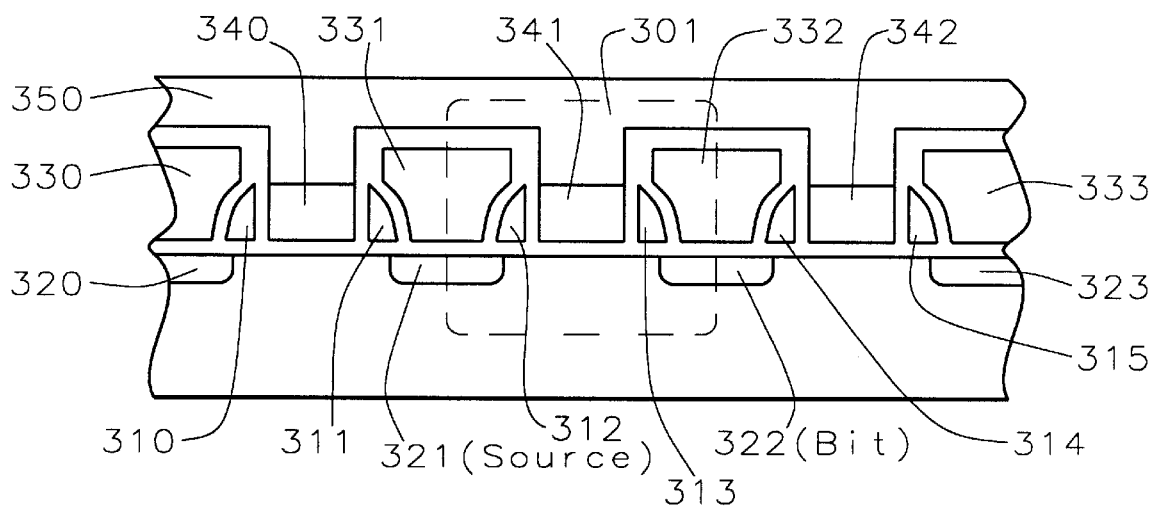
FIG. 3B is a layout cross-section of the prior art double side wall dual-bit split floating gate cell with ultra short ballistic channel.

During read operation of nitride region 313, shown in FIG. 3C, the source line 321 can be set to some intermediate voltage (~1.2V) and the bit line 322 may be precharged to 0V. In addition, the following conditions must be met in order to read a selected nitride charge region: 1) the word select gate voltage must be raised from 0V to a voltage (2.5V) which is some delta greater than the sum of the threshold voltage of the word select gate (Vt-wl=0.5V) and the source voltage (1.2V), and 2) the voltage of the control gate above the selected nitride charge region must be near Vt-hi ("express"). The voltage of the control gate above the unselected nitride charge regions must be greater than the source voltage plus Vt-hi ("over-ride"). The control gates above the unselected adjacent nitride charge regions must be zero ("suppress"). The voltage of the bit diffusion 322 can be monitored by a sense amplifier and compared to a switchable reference voltage, or several sense amplifiers each with a different reference voltage, to determine the binary value that corresponds to nitride charge region 313's threshold voltage, in a serial or parallel read manner, respectively. Thus, by over-riding the unselected nitride region within the selected memory cell, and then suppressing the adjacent cell unselected nitride regions, the threshold state of an individual selected nitride region can be determined.

For ballistic channel hot electron injection, electrons are energized by a high source-drain potential, to inject through the oxide and onto the nitride. The magnitude of the programmed threshold voltage can be controlled by the source-drain potential and the program duration. Table 2 describes the voltages to program multiple threshold voltages to a selected nitride region 313. These voltages are for example only, to facilitate description of the program method, and are not limiting in any way. In Table 2A, the control gates 331, 332 associated with the selected memory cell 301 are raised to a high voltage (5V) to over-ride the nitride charge regions 12 and 313.

Program of the desired threshold level is determined by the bit diffusion 322: The bit diffusion 322 is fixed to 5V, 4.5V, or 4.0V in order to program threshold voltages of 2.0V, 1.6V and 1.2V, respectively. When the word line 350 is raised above the word gate's 341 threshold, high energy electrons will be released into the channel, and injection begins. To inhibit program in the adjacent memory cells, the far adjacent control gates are set to 0V, so there will be no electrons in the channels of the adjacent memory cells. Thus, multi-level threshold program can be achieved by bit diffusion voltage control for this high density memory array. It is also possible to program multiple thresholds by varying the word line voltage, for example 4.5V, 5V and 5.5V, to program 1.2V, 1.6V and 2.0V, respectively.

Another possible method of program is to vary the control gate voltage in order to obtain different threshold levels. If multi-levels are to be obtained by control gate voltage, the unselected control gate 331 within the selected memory cell 301 will be set high to 5V in order ride nitride region 312. The control gate 332 over the selected nitride region 313 will be varied to 4.5V, 5V and 5.5V, to obtain threshold voltages of 1.2V, 1.6V and 2.0V, respectively.

A fourth program method variation to the voltage conditions described for multi-level program is given in Table 2B, in which the selected control gate voltage matches the bit voltage for Vd=5V, 4.5V, and 4.0V and Vcg=5V, 4.5V, and 4.0V, respectively.

TABLE 2A

Bit Diffusion Method Program of Selected Nitride Charge Region 313

| Vt Data | Vd0 320 | Vcg 0 330 | Vw1 340 | Vd1 321 | Vcg 1 331 | Vw1 341 | Vd2 322 | Vcg 2 332 | Vw1 342 | Vd3 323 | Vcg 3 333 |
|---|---|---|---|---|---|---|---|---|---|---|---|
| 00 | 0 | 0 | 2.0 | ~0 | 5 | 2.0 | 5 | 5 | 2.0 | 0 | 0 |
| 01 | 0 | 0 | 2.0 | ~0 | 5 | 2.0 | 4.5 | 5 | 2.0 | 0 | 0 |
| 10 | 0 | 0 | 2.0 | ~0 | 5 | 2.0 | 4.0 | 5 | 2.0 | 0 | 0 |

TABLE 2B

Control Gate-Bit Method Program of Selected Nitride Charge Region 313

| Vt Data | Vd0 320 | Vcg 0 330 | Vw1 340 | Vd1 321 | Vcg 1 331 | Vw1 341 | Vd2 322 | Vcg 2 332 | Vw1 342 | Vd3 323 | Vcg 3 333 |
|---|---|---|---|---|---|---|---|---|---|---|---|
| 00 | 0 | 0 | 2.0 | ~0 | 5 | 2.0 | 5 | 5 | 2.0 | 0 | 0 |
| 01 | 0 | 0 | 2.0 | ~0 | 4.5 | 2.0 | 4.5 | 4.5 | 2.0 | 0 | 0 |
| 10 | 0 | 0 | 2.0 | ~0 | 4.0 | 2.0 | 4.0 | 4.0 | 2.0 | 0 | 0 |

Because the program current is low, and by programming schemes described above, it is possible to program several cells on the same word line in a parallel operation. Furthermore, depending on the peripheral decoding circuitry, multiple thresholds may also be programmed simultaneously, if the program methods of bit diffusion or control gate control are used. It should be noted however, that selected memory cells can have no fewer than two memory cells between each other, in order to obtain properly isolated behavior. Also, in order to obtain the tight Vt margins which are necessary for multi-level operation, the threshold voltage should be periodically checked during program, by a program verify cycle which is similar to a read operation. Program verify for the ballistic short channel sidewall MONOS in this invention is simpler than conventional floating gate and MONOS memories because program voltages are so low and very similar to read voltage conditions.

Removal of electrons from the nitride region during erase can be done by hot hole injection from the nitride region to the diffusion, or by F-N tunneling from the nitride region to the control gate. In the hot hole injection method, the substrate is grounded, diffusions are set to 5V and negative 5V is applied to the control gate. For F-N tunneling, a negative 3.5V is applied to both the substrate and diffusions and positive 5V is applied to the control gates. A block of nitride regions must be erased at once. A single nitride region cannot be erased.

PREFERRED EMBODIMENT FOR READ

Figure 8A:
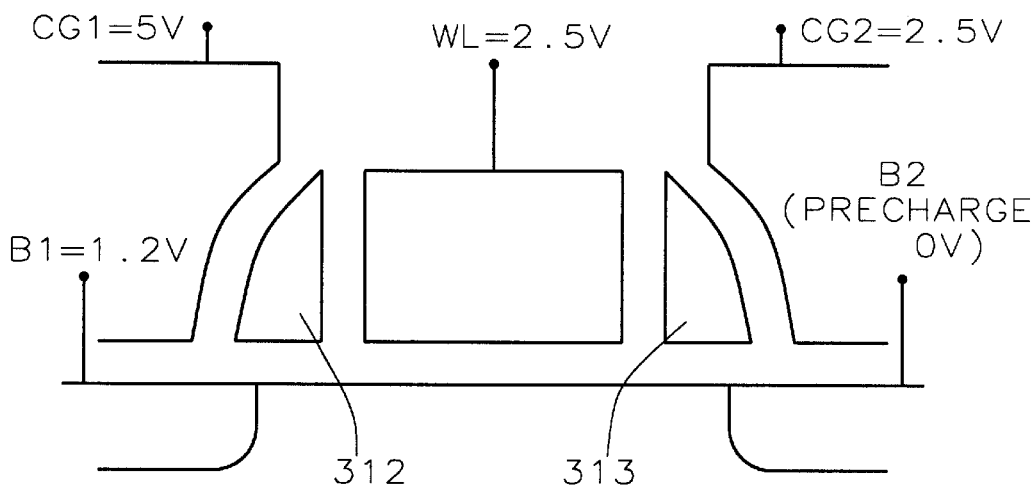
FIGS. 8A, 8B, and 8C are graphical representations of voltage sensing curves for the present invention during read.
Figure 8B:
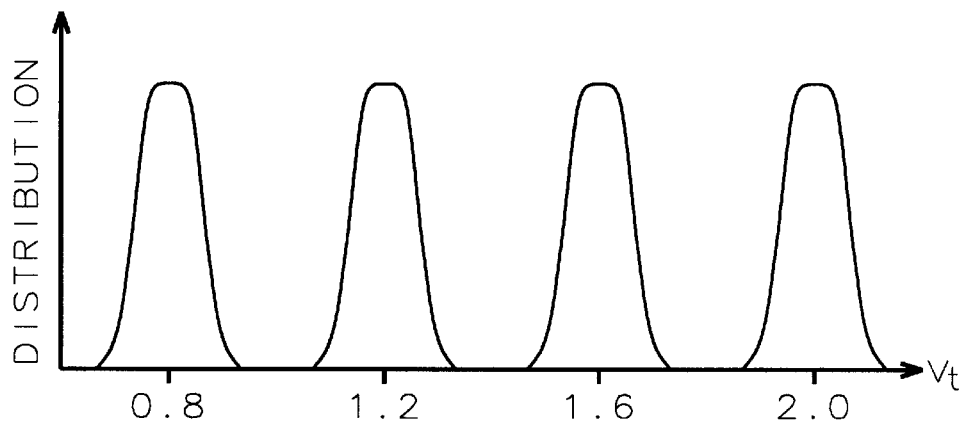

Read operation for a two bit multi-level storage in each of the nitride regions will be described, based on simulations for a 0.25u process. FIG. 8A illustrates the memory cell and voltage conditions for a read of nitride charge region 313. The threshold voltages for the four levels of storage are 0.8V, 1.2V 1.6V and 2.0 for the "11", "10", and "01" and "00" states, respectively. This is shown in FIG. 8B. The threshold voltage for the word select gate is 0.5V. During read, the source voltage is fixed to 1.2V. The control gate above the unselected nitride charge region is set to 5V, which overrides all possible threshold states, and the control gate above the selected nitride charge region is set to 2.0V, which is the highest threshold voltage of all the possible threshold states. All other control gates are set to zero, and the bit junction is precharged to zero. The word line is then raised from 0V to 1.0V, and the bit junction is monitored.

Figure 8C:
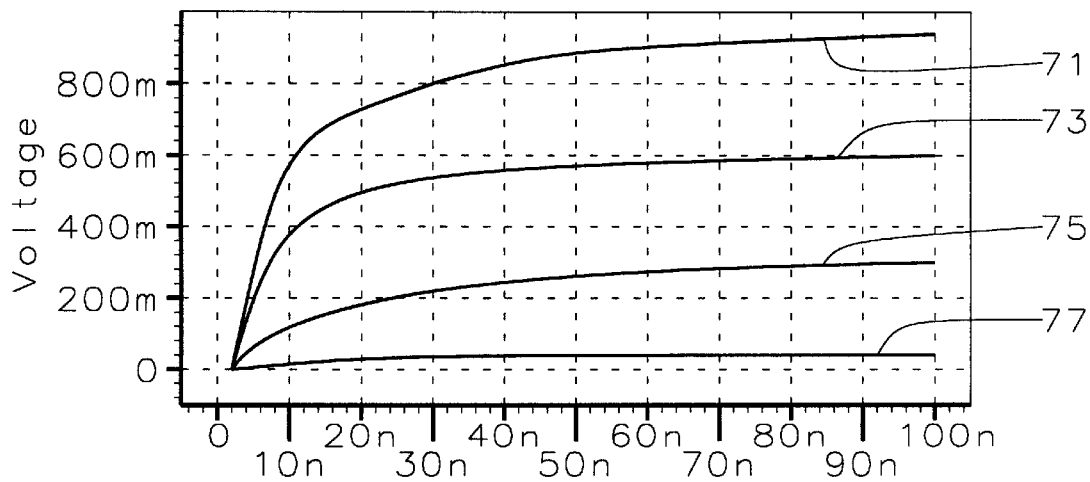

Sensing the bit junction yields the curves shown in FIG. 8C. Bit line voltage sensing curves 71, 73, 75, and 77 during read of nitride charge region 313 are shown for different thresholds 0.8V, 1.2V, 1.6V, and 2.0V, respectively. It can be seen from the voltage curves, that the voltage difference between each of the states is approximately 300 mV, which is well within sensing margins. Simulation has also confirmed that the sate of the unselected cell has very little impact on the bit junction voltage curve in FIG. 8C.

The present invention provides a method for forming a double side wall control gate having an ONO nitride charge storage region underneath with an ultra short channel. The enhancement mode channel is around 35 nm, and is defined by the side wall spacer. The isolation between the word gates is formed by a self-aligned $SiO_2$ filling technique. The polysilicon control gate is formed by a self-aligned technique using chemical mechanical polishing. The process of the invention include two embodiments: a planar short channel structure with ballistic injection and a step split short channel structure with ballistic injection. A third embodiment provides isolation of adjacent word gates after control gate definition.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a MONOS memory device comprising:

forming a gate silicon oxide layer on the surface of a semiconductor substrate;

depositing a first polysilicon layer overlying said gate silicon oxide layer;

depositing a first nitride layer overlying said first polysilicon layer;

patterning said first polysilicon layer and said first nitride layer to form word gates wherein a gap is left between two of said word gates;

forming a first insulating layer on the sidewalls of said word gates;

depositing a spacer layer overlying said word gates and said gate silicon oxide layer;

anisotropically etching away said spacer layer to leave disposable spacers on the sidewalls of said word gates;

implanting ions into said semiconductor substrate to form a lightly doped region wherein said disposable spacers act as an implantation mask;

thereafter removing said disposable spacers;

depositing a nitride-containing layer over said semiconductor substrate in said gap;

depositing a second polysilicon layer overlying said word gates and said nitride-containing layer;

anisotropically etching away said second polysilicon layer and said nitride-containing layer to leave polysilicon spacers on the sidewalls of said word gates wherein said polysilicon spacers form control sidewall spacer gates and wherein said nitride-containing layer underlying each of said control sidewall spacer gates forms a nitride region in which charge is stored;

forming a second insulating layer on said control sidewall spacer gates;

implanting ions into said semiconductor substrate to form a bit diffusion region wherein said control sidewall spacer gates act as an implantation mask;

coating a gap filling material over the surface of said substrate wherein said gap-filling material fills said gap between said two of said word gates;

planarizing said gap-filling material;

thereafter removing said first nitride layer overlying said word gates; and depositing a third polysilicon layer overlying said substrate wherein said third polysilicon layer forms a word line connecting underlying said word gates to complete said fabrication of said MONOS memory device.

2. The method according to claim 1 wherein said gate silicon oxide layer has a thickness of between about 5 and 10 nanometers.

3. The method according to claim 1 wherein said first polysilicon layer is deposited by chemical vapor deposition to a thickness of between about 150 and 250 nanometers.

4. The method according to claim 1 wherein said first nitride layer is deposited by chemical vapor deposition to a thickness of between about 50 and 100 nanometers.

5. The method according to claim 1 wherein said first insulating layer is formed by thermally growing a silicon oxide layer to a thickness of between about 5 and 10 nanometers on the sidewalls of said word gates.

6. The method according to claim 1 wherein said first insulating layer is formed by depositing a silicon oxide layer by chemical vapor deposition to a thickness of between about 5 and 10 nanometers on the sidewalls of said word gates.

7. The method according to claim 1 wherein said first insulating layer is formed by depositing a silicon nitride layer to a thickness of between about 5 and 10 nanometers on the sidewalls of said word gates.

8. The method according to claim 1 wherein said first insulating layer is formed by depositing a silicon oxide layer and a silicon nitride layer to a combined thickness of between about 5 and 10 nanometers on the sidewalls of said word gates.

9. The method according to claim 1 wherein said spacer layer comprises one of the group containing polysilicon, plasma nitride, plasma oxynitride, and borophosphosilicate glass (BPSG) and has a thickness of between about 30 and 50 nanometers.

10. The method according to claim 1 wherein said step of removing said disposable spacers comprises a dry chemical anisotropic etch.

11. The method according to claim 1 wherein said step of depositing said nitride-containing layer comprises:

growing a first silicon oxide layer to a thickness of between about 3.6 and 5.0 nanometers on said semiconductor substrate;

depositing a silicon nitride layer having a thickness of about 2 to 5 nanometers overlying said first silicon oxide layer; and depositing a second silicon oxide layer having a thickness of between about 4 and 8 nanometers overlying said silicon nitride layer.

12. The method according to claim 1 further comprising nitriding said gate silicon oxide layer before said step of depositing said first nitride layer.

13. The method according to claim 1 wherein said second polysilicon layer has a thickness of between about 30 and 50 nanometers.

14. The method according to claim 1 wherein said second polysilicon layer has a thickness of between about 30 and 50 nanometers and further comprising depositing a tungsten silicide layer having a thickness of between about 60 and 100 nanometers and wherein said second polysilicon layer and tungsten silicide layer together form said control sidewall spacer gates.

15. The method according to claim 1 wherein said second insulating layer comprises silicon oxide deposited by chemical vapor deposition to a thickness of about 10 nanometers.

16. The method according to claim 1 wherein said second insulating layer comprises silicon nitride deposited by chemical vapor deposition to a thickness of about 10 nanometers.

17. The method according to claim 1 further comprising:

anisotropically etching said second insulating layer to form sidewall oxide spacers on lower portions of said control sidewall spacer gates; and thereafter siliciding upper portions of said control sidewall spacer gates and said bit diffusion region.

18. The method according to claim 1 wherein said gap-filling material comprises one of the group containing silicon oxide and borosilicate glass.

19. The method according to claim 1 wherein said gap-filling material comprises a conductive material and further comprising:

recessing said conductive material below the surface of said first nitride layer;

depositing a silicon oxide layer overlying said recessed conductive material; and planarizing said silicon oxide layer wherein said conductive material and underlying said control sidewall spacer gates together form a control gate.

20. The method according to claim 1 wherein said third polysilicon layer has a thickness of between about 150 and 200 nanometers.

21. The method according to claim 1 further comprising siliciding said word line.

22. A method for fabricating a step split structure MONOS memory device comprising:

forming a gate silicon oxide layer on the surface of a semiconductor substrate;

depositing a first polysilicon layer overlying said gate silicon oxide layer;

depositing a first nitride layer overlying said first polysilicon layer;

patterning said first polysilicon layer and said first nitride layer to form word gates wherein a gap is left between two of said word gates;

forming a first insulating layer on the sidewalls of said word gates;

depositing a spacer layer overlying said word gates and said gate silicon oxide layer;

anisotropically etching away said spacer layer to leave disposable spacers on the sidewalls of said word gates;

etching away said gate silicon oxide layer not covered by said word gates and said disposable spacers to expose a portion of said semiconductor substrate;

etching away said exposed portion of said semiconductor substrate to form a step into said substrate;

implanting ions into said semiconductor substrate to form a lightly doped region wherein said disposable spacers act as an implantation mask;

thereafter removing said disposable spacers;

removing said gate silicon oxide layer underlying said disposable polysilicon spacers;

forming a composite layer of oxide-nitride-oxide overlying said semiconductor substrate;

depositing a second polysilicon layer overlying said word gates and said composite layer;

anisotropically etching away said second polysilicon layer and said composite oxide-nitride-oxide layer to leave polysilicon spacers on the sidewalls of said word gates wherein said polysilicon spacers form sidewall control gates and wherein the nitride portion of said composite oxide-nitride-oxide layer underlying each of said sidewall control gates forms a nitride region in which charge is stored;

forming a second insulating layer on said control sidewall gates;

implanting ions into said semiconductor substrate to form a bit diffusion region wherein said control sidewall gates act as an implantation mask;

coating a gap filling material over the surface of said substrate wherein said gap-filling material fills said gap between said two of said word gates;

planarizing said gap-filling material;

thereafter removing said first nitride layer overlying said word gates; and depositing a third polysilicon layer overlying said substrate wherein said third polysilicon layer forms a word line connecting underlying said word gates to complete said fabrication of said MONOS memory device.

23. The method according to claim 22 wherein said first polysilicon layer is deposited by chemical vapor deposition to a thickness of between about 150 and 250 nanometers.

24. The method according to claim 22 wherein said first nitride layer is deposited by chemical vapor deposition to a thickness of between about 50 and 100 nanometers.

25. The method according to claim 22 wherein said first insulating layer is formed by thermally growing a silicon oxide layer to a thickness of between about 5 and 10 nanometers on the sidewalls of said word gates.

26. The method according to claim 22 wherein said first insulating layer has a thickness of between about 5 and 10 nanometers on the sidewalls of said word gates.

27. The method according to claim 22 wherein said spacer layer comprises one of the group containing polysilicon, plasma nitride, plasma oxynitride, and borophosphosilicate glass (BPSG) and has a thickness of between about 30 and 50 nanometers.

28. The method according to claim 22 wherein said step of removing said disposable spacers comprises a dry chemical anisotropic etch.

29. The method according to claim 22 wherein said step into said semiconductor substrate has a depth of between about 20 and 50 nanometers.

30. The method according to claim 22 after said step of removing said gate silicon oxide layer underlying said disposable spacers further comprising rounding the corners of said step.

31. The method according to claim 30 wherein said step of rounding said corners of said step comprises a rapid thermal anneal at between about 1000 and 1100° C. for about 60 seconds.

32. The method according to claim 30 wherein said step of rounding said corners of said step comprises annealing in hydrogen at about 900° C. at a pressure of between about 200 and 300 mtorr.

33. The method according to claim 22 wherein said oxide-nitride-oxide composite layer comprises:

a first silicon oxide layer having a thickness of between about 3.6 and 5.0 nanometers;

a second silicon nitride layer having a thickness of about 2 to 5 nanometers; and a third silicon oxide layer having a thickness of between about 4 and 8 nanometers.

34. The method according to claim 22 wherein said second polysilicon layer has a thickness of between about 30 and 50 nanometers.

35. The method according to claim 22 wherein said second polysilicon layer has a thickness of between about 30 and 50 nanometers and further comprising depositing a tungsten silicide layer having a thickness of between about 60 and 100 nanometers and wherein said third polysilicon layer and tungsten silicide layer together form said control sidewall spacer gates.

36. The method according to claim 22 wherein said second insulating layer comprises silicon oxide deposited by chemical vapor deposition to a thickness of about 10 nanometers.

37. The method according to claim 22 wherein said second insulating layer comprises silicon nitride deposited by chemical vapor deposition to a thickness of about 10 nanometers.

38. The method according to claim 22 further comprising:

anisotropically etching said second insulating layer to form sidewall oxide spacers on lower portions of said control sidewall spacer gates; and thereafter siliciding upper portions of said control sidewall spacer gates and said bit diffusion region.

39. The method according to claim 22 wherein said gap-filling material comprises one of the group containing silicon oxide and borosilicate glass.

40. The method according to claim 22 wherein said gap-filling material comprises a conductive material and further comprising:

recessing said conductive material below the surface of said first nitride layer;

depositing a silicon oxide layer overlying said recessed conductive material; and planarizing said silicon oxide layer wherein said conductive material and underlying said control sidewall spacer gates together form a control gate.

41. The method according to claim 22 wherein said third polysilicon layer has a thickness of between about 90 and 180 nanometers.

42. The method according to claim 22 further comprising siliciding said word line.

43. A method for fabricating a MONOS memory device comprising:

forming a nitride-containing layer on the surface of a semiconductor substrate;

depositing a first polysilicon layer overlying said nitride-containing layer;

depositing a second nitride layer overlying said first polysilicon layer;

patterning said first polysilicon layer and said second nitride layer to form word gates wherein a gap is left between two of said word gates;

forming a first insulating layer on the sidewalls of said word gates;

depositing a spacer layer overlying said word gates and said nitride containing layer;

anisotropically etching away said spacer layer to leave disposable spacers on the sidewalls of said word gates;

implanting ions into said semiconductor substrate to form a bit diffusion junction wherein said disposable spacers act as an implantation mask;

thereafter removing said disposable spacers;

depositing a second polysilicon layer overlying said word gates and filling said gap;

recessing said second polysilicon layer below a surface of said second nitride layer;

siliciding said recessed second polysilicon layer wherein said silicided recessed second polysilicon layer forms a control gate;

depositing a second insulating layer overlying said silicided recessed second polysilicon layer;

thereafter removing said second nitride layer overlying said word gates; and depositing a third polysilicon layer overlying said substrate wherein said third polysilicon layer forms a word line connecting underlying said word gates to complete said fabrication of said MONOS memory device.

44. The method according to claim 43 wherein said step of forming said nitride-containing layer comprises:

growing a first silicon oxide layer to a thickness of between about 3.6 and 5.0 nanometers on said semiconductor substrate;

depositing a silicon nitride layer having a thickness of about 2 to 5 nanometers overlying said first silicon oxide layer; and depositing a second silicon oxide layer having a thickness of between about 4 and 8 nanometers overlying said silicon nitride layer.

45. The method according to claim 44 further comprising nitriding said first silicon oxide layer before said step of depositing said silicon nitride layer.

46. The method according to claim 43 wherein said first polysilicon layer is deposited by chemical vapor deposition to a thickness of between about 150 and 250 nanometers.

47. The method according to claim 43 wherein said second nitride layer is deposited by chemical vapor deposition to a thickness of between about 50 and 100 nanometers.

48. The method according to claim 43 wherein said first insulating layer is formed to a thickness of between about 5 and 10 nanometers on the sidewalls of said word gates.

49. The method according to claim 43 wherein said spacer layer comprises one of the group containing polysilicon, plasma nitride, plasma oxynitride, and borophosphosilicate glass (BPSG) and has a thickness of between about 30 and 50 nanometers.

50. The method according to claim 43 further comprising before said step of removing said disposable spacers:

etching away said second silicon oxide layer not covered by said disposable spacers;

depositing a third silicon oxide layer overlying said nitride layer to a thickness of between about 4 and 6 nanometers; and oxidizing said third silicon oxide layer to form an oxide layer having a thickness of about 20 nanometers over said nitride layer whereby coupling capacitance between said control gate and said bit diffusion is reduced.

51. The method according to claim 43 wherein said step of removing said disposable spacers comprises a dry chemical anisotropic etch.

52. The method according to claim 43 wherein said second polysilicon layer has a thickness of between about 30 and 50 nanometers.

53. The method according to claim 43 wherein said second insulating layer comprises silicon oxide deposited by chemical vapor deposition to a thickness of about 10 nanometers.

54. The method according to claim 43 wherein said second insulating layer comprises silicon nitride deposited by chemical vapor deposition to a thickness of about 10 nanometers.

55. The method according to claim 43 wherein said third polysilicon layer has a thickness of between about 150 and 200 nanometers.

56. A method for fabricating a flash memory device comprising:

providing word gates overlying a gate silicon oxide layer on the surface of a semiconductor substrate wherein a gap is left between two of said word gates;

forming disposable spacers on the sidewalls of said word gates;

implanting ions into said semiconductor substrate to form a lightly doped region wherein said disposable spacers act as an implantation mask;

thereafter removing said disposable spacers;

forming sidewall polysilicon gates on the sidewalls of said word gates, each of said sidewall polysilicon gates having an underlying nitride-containing layer wherein the nitride region of said nitride-containing layer acts as a nitride charge region;

implanting ions into said semiconductor substrate to form a bit diffusion region wherein said sidewall polysilicon gates act as an implantation mask;

forming an insulating layer on said sidewall gates;

filling said gap between said two of said word gates with a second polysilicon layer;

recessing said second polysilicon layer;

siliciding said recessed second polysilicon layer;

covering said silicided recessed second polysilicon layer with an oxide layer wherein said silicided recessed second polysilicon layer along with underlying said sidewall polysilicon gates form a control gate; and depositing a third polysilicon layer overlying said substrate wherein said third polysilicon layer forms a word line connecting said word gates to complete said fabrication of said flash memory device.

57. The method according to claim 56 wherein said first polysilicon layer has a thickness of between about 150 and 250 nanometers.

58. The method according to claim 56 wherein said disposable spacers comprise one of the group containing polysilicon, plasma nitride, plasma oxynitride, and borophosphosilicate glass (BPSG).

59. The method according to claim 56 wherein said nitride-containing layer comprises a first layer of silicon oxide, a second layer of silicon nitride, and a third layer of silicon oxide.

60. The method according to claim 56 after said step of removing said disposable spacers further comprising etching into said semiconductor substrate to form a step into said semiconductor substrate having a depth of between about 20 and 50 nanometers.

61. The method according to claim 56 further comprising rounding the corners of said step.

62. The method according to claim 61 wherein said step of rounding said corners of said step comprises a rapid thermal anneal at between about 1000 and 1100° C. for about 60 seconds.

63. The method according to claim 61 wherein said step of rounding said corners of said step comprises annealing in hydrogen at about 900° C. at a pressure of between about 200 and 300 mtorr.

64. The method according to claim 56 wherein a channel length defined from an edge of said word gate to an edge of adjacent said bit diffusion region is between about 30 and 50 nm and whereby ballistic electron injection occurs.

* * * * *